United States Patent [19]

Michel et al.

[11] Patent Number: 4,539,492
[45] Date of Patent: Sep. 3, 1985

[54] DARLINGTON TRANSISTOR CIRCUIT

[75] Inventors: Hartmut Michel, Reutlingen; Lothar Gademann, Rottenburg; Erich Jesse, Marbach, all of Fed. Rep. of Germany

[73] Assignee: Robert Bosch GmbH, Stuttgart, Fed. Rep. of Germany

[21] Appl. No.: 464,503

[22] PCT Filed: Mar. 5, 1982

[86] PCT No.: PCT/DE82/00045
§ 371 Date: Jan. 27, 1983
§ 102(e) Date: Jan. 27, 1983

[87] PCT Pub. No.: WO82/04509
PCT Pub. Date: Dec. 23, 1982

[30] Foreign Application Priority Data

Jun. 15, 1981 [DE] Fed. Rep. of Germany ....... 3123667

[51] Int. Cl.³ .................. H03K 3/26; H03K 3/313
[52] U.S. Cl. .................... 307/315; 307/270; 307/310; 307/317 R
[58] Field of Search ............. 307/315, 270, 254, 317, 307/310

[56] References Cited

U.S. PATENT DOCUMENTS

| | | | |
|---|---|---|---|
| 2,663,806 | 12/1953 | Darlington | 307/315 |
| 3,281,639 | 10/1966 | Potter et al. | 307/315 |
| 3,390,247 | 6/1968 | Webb | |
| 3,454,737 | 7/1969 | Pfau et al. | |
| 3,465,480 | 9/1969 | Hausermann | |
| 4,020,816 | 5/1977 | Chateau | 363/91 |

FOREIGN PATENT DOCUMENTS

| | | | |
|---|---|---|---|
| 0009957 | 4/1980 | European Pat. Off. | |
| 2339896 | 2/1975 | Fed. Rep. of Germany | |
| 452666 | 5/1968 | Switzerland | 307/315 |
| 2025180 | 1/1980 | United Kingdom | |

OTHER PUBLICATIONS

IBM Technical Disclosure Bulletin, vol. 15, No. 4, 9-72, Self Clamping Driver, p. 1246.

Primary Examiner—Stanley D. Miller
Assistant Examiner—B. P. Davis
Attorney, Agent, or Firm—Frishauf, Holtz, Goodman & Woodward

[57] ABSTRACT

A three-stage Darlington transistor circuit having a power transistor ($T_3$), a driver transistor ($T_2$) and an initial transistor ($T_1$) is provided. The collectors of these three transistors are connected with one another, while the emitter of the driver transistor ($T_2$) is connected to the base of the power transistor ($T_3$), and the emitter of the initial transistor ($T_1$) is connected to the base of the driver transistor ($T_2$). Connected to the base of the driver transistor ($T_2$) is a series circuit comprising a first resistor ($R_1$), which is connected directly to this base, and a Zener diode (ZD), the anode of the Zener diode being connected with the resistor ($R_1$); and a second resistor ($R_2$); the second resistor ($R_2$) is connected in parallel to the emitter-base path of the driver transistor ($T_2$). Upon the attainment of a predetermined voltage at the cathode of the Zener diode (ZD), the driver transistor ($T_2$) and the power transistor ($T_3$) are switched ON. The temperature dependency of this switch-on voltage can be adjusted by varying the resistance ratio of these two resistors ($R_1$, $R_2$).

7 Claims, 1 Drawing Figure

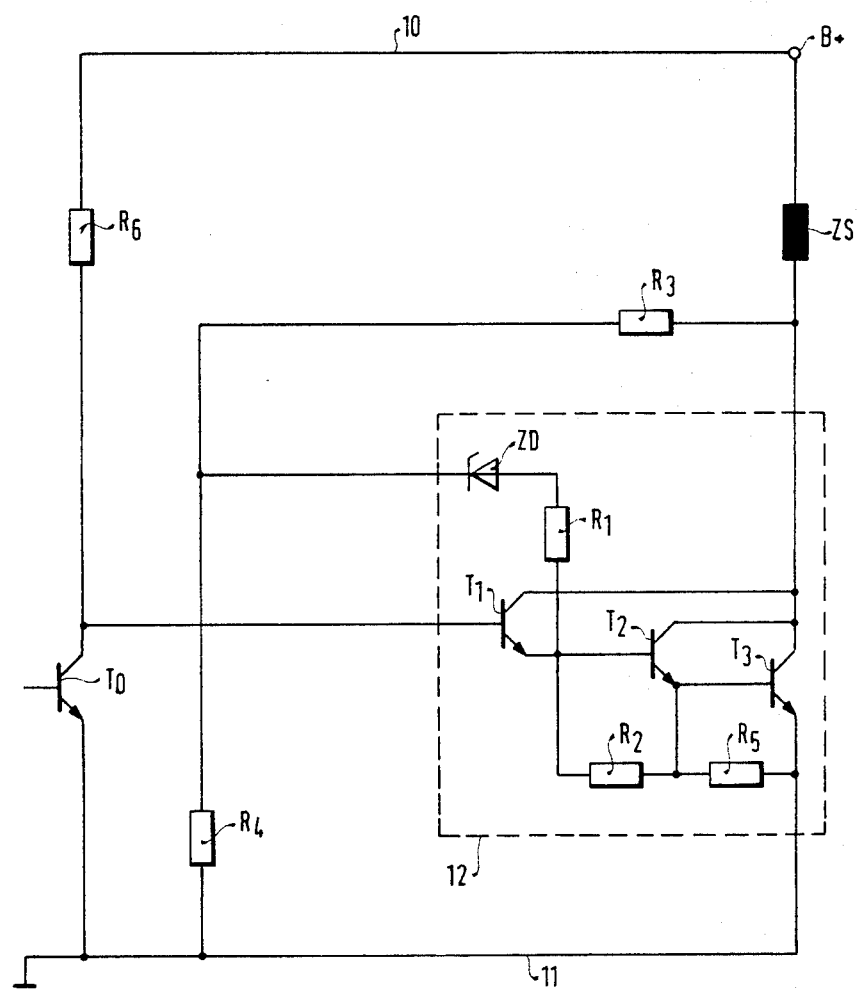

DARLINGTON TRANSISTOR CIRCUIT

The invention relates to a Darlington transistor circuit.

BACKGROUND

It is known to provide a Darlington transistor circuit having a power transistor and a driver transistor, the collector of which is connected to the collector of the power transistor and the emitter of which is connected to the base of the power transistor, and having an initial transistor, the collector of which is connected to the collector of the power transistor and the emitter of which is connected to the base of the driver transistor and the base of which is triggerable by means of an input signal. A Darlington transistor circuit of this general type is already known from FIG. 8 of U.S. Pat. No. 2,663,806, Darlington.

THE INVENTION

It is an object to control the temperature dependency of the switch-on voltage of a Darlington transistor circuit in accordance with a predetermined desired relationship.

Briefly, a Darlington transistor circuit which has a power transistor and a driver transistor includes a series connection of a Zener diode and a voltage divider, the base of the driver transistor being connected to the tap or junction circuit between two resistors of the voltage divider circuit. One of the resistors has its terminal remote from the junction connected to the Zener diode which, in turn, is connected for example through an inductive load to a tap point of another voltage divider; the second resistor of the first voltage divider has its terminal remote from the junction connected to the emitter of the driver transistor which, in accordance with standard Darlington circuitry, also includes a connection to the base of the output transistor.

When a predetermined voltage is placed on a cathode of the Zener diode, the driver transistor and the power transistor are both switched ON. In accordance with an advantage of the present invention, the temperature dependency of this switch-on voltage can be adjusted by adjusting the ratio of resistances between the first and second resistors forming the first voltage divider. The switch-on voltage can be transformed up as a collector-emitter limiting via the second voltage divider to the junction or tap point, of which, for example, the anode of the Zener diode is connected.

The circuit has the additional advantage that the switching time, for example to disconnect an inductive load, can be shortened and improved energy distribution can be obtained during clamped operation.

Some of the circuit elements, typically the first voltage divider resistor and the Zener diode, can be monolithically integrated with the Darlington transistor structure.

DRAWING

The single FIGURE shows the electrical circuit diagram of a Darlington transistor circuit according to the invention.

DETAILED DESCRIPTION OF THE EXEMPLARY EMBODIMENT

A first current supply line 10 is connected with the terminal B+ of a positive supply voltage. A second current supply line 11 is connected to ground. An n-p-n power transistor $T_3$ is connected with its emitter to the second current supply line 11 and with its collector, via an inductive load ZS, to the first current supply line 10. An n-p-n driver transistor $T_2$ is connected at the input side of the n-p-n power transistor $T_3$. The collectors of the two transistors $T_2$ and $T_3$ are thereby connected, while the emitter of the driver transistor $T_2$ is connected to the base of the power transistor $T_3$. An n-p-n initial transistor $T_1$ is connected at the input side of the n-p-n driver transistor $T_2$. The collectors of the two transistors $T_2$ and $T_1$ are likewise connected to one another, while the emitter of the initial transistor $T_1$ is connected to the base of the driver transistor $T_2$. The circuit device comprising the three transistors $T_1$, $T_2$ and $T_3$ is generally known as a three-stage Darlington circuit. The base of the initial transistor $T_1$ is triggerable by means of an input signal.

Connected to the base of the driver transistor $T_2$ is the series circuit comprising a first resistor $R_1$, which is connected directly to this base, and a Zener diode ZD; the anode of the Zener diode ZD is connected with the resistor $R_1$. A second resistor $R_2$ is furthermore disposed parallel to the emitter-base path of the driver transistor $T_2$. As a result of the disposition of the Zener diode ZD and the resistors $R_1$ and $R_2$, the driver transistor $T_2$ and the power transistor $T_3$ are switched ON when a predetermined voltage occurs at the cathode of the Zener diode ZD. The temperature dependency of this switch-on voltage can be adjusted by means of the resistance ratio of the resistors $R_1$ and $R_2$.

The cathode of the Zener diode ZD is connected to the pickup or tap point of a voltage divider, which comprises a third resistor $R_3$ and a fourth resistor $R_4$. The free end of the resistor $R_3$ is connected to the collector of the power transistor $T_3$, while the free end of the resistor $R_4$ is connected to the ground current supply line 11. As a result of the disposition of the voltage divider $R_3$, $R_4$, the switch-on voltage at which the driver transistor $T_2$ and the power transistor $T_3$ are switched ON is transformed up, as a collector-emitter limiting voltage, via the division ratio of this voltage divider.

The base of the initial transistor $T_1$ is connected to the collector of an n-p-n control transistor $T_0$, the emitter of which is connected to the second supply current line 11 and the collector of which is connected via a collector resistor $R_6$ to the first current supply line 10.

A resistor $R_5$ in the range of a few ohms is provided parallel to the emitter-base path of the power transistor $T_3$. This causes an additional shortening of the switching time and an improved distribution of energy during clamped operation.

The particular circuit elements which are to be embodied in a monolithically integrated form are encompassed in the drawing with a dashed line 12.

We claim:
1. Darlington transistor circuit for switching of an inductive load (ZS) having
   a current supply voltage source;
   a power transistor ($T_3$);
   a driver transistor ($T_2$), the collector of the power transistor ($T_3$) and the collector of the driver transistor ($T_2$) being connected together, the base of the power transistor ($T_3$) and the emitter of the driver transistor ($T_2$) being connected together;
   an initial transistor ($T_1$), the collector of the initial transistor ($T_1$) being connected to the collector of the power transistor ($T_3$), the emitter of the initial transistor ($T_2$) being connected to the base of the driver transistor ($T_2$);

means ($T_0$) providing an input trigger signal to the base of the initial transistor ($T_1$), said Darlington transistor circuit comprising a series circuit including a voltage divider comprising a first resistor ($R_1$) and a second resistor ($R_2$) forming the voltage divider, and having a tap or junction point between the first and second resistor, the tap or junction point being connected to the base of the driver transistor ($T_2$), said series circuit further including a Zener diode (ZD), the terminal of the first resistor ($R_1$) remote from the tap or junction point being connected to the anode of the Zener diode (ZD), the cathode of the Zener diode being connected to a terminal (B+) of the current supply voltage source through the inductive load, the terminal of the second resistor ($R_2$) remote from the tap or junction point being connected to the emitter of the driver transistor ($T_2$), so that the second resistor ($R_2$) will be connected in parallel across the base-emitter path of the driver transistor, and wherein the ratio of resistances of the first ($R_1$) and the second ($R_2$) resistors is selected in accordance with a selected temperature/turn-ON voltage relationship at the cathode of the Zener diode (ZD).

2. Darlington transistor circuit according to claim 1, wherein a second voltage divider ($R_3$, $R_4$) is provided, connected through the inductive load to the current supply voltage source; and the tap or junction point of the second voltage divider is connected to the cathode of the Zener diode, and the other terminals of the voltage divider being connected, respectively, to the collector and emitter of the power transistor ($T_3$).

3. Darlington transistor circuit according to claim 2, wherein the inductive load (ZS) is serially connected with the emitter-collector path of the power transistor ($T_3$);

and wherein the trigger circuit includes a switching transistor ($T_0$) connected to short-circuit the base-emitter path of the initial transistor ($T_1$) upon turn-OFF of the inductive load (ZS) whereby short switching time is obtained.

4. Darlington transistor circuit according to claim 1, wherein the inductive load (ZS) is serially connected in the emitter-collector path of the power transistor ($T_3$), and wherein the input trigger signal provides a voltage which is negative with respect to the emitter of the initial transistor ($T_1$) at its base upon turn-OFF of the inductive load, thereby obtaining short turn-OFF switching time.

5. Darlington transistor circuit according to claim 1, further including a fifth resistor ($R_5$) connected parallel to the base-emitter path of the power transistor ($T_3$), said fifth resistor ($R_5$) having a value which is lower than that of any one of the resistors of the voltage divider ($R_1$, $R_2$).

6. Darlington transistor circuit according to claim 1, wherein the power transistor ($T_3$), the driver transistor ($T_2$), the initial transistor ($T_1$), the Zener diode (ZD), the first resistor ($R_1$) and the second resistor ($R_2$) form a monolithically integrated structure.

7. Darlington transistor circuit according to claim 5, wherein said fifth resistor ($R_5$) forms part of a monolithically integrated structure.

* * * * *